US011949035B2

(12) United States Patent
Rideau et al.

(10) Patent No.: US 11,949,035 B2
(45) Date of Patent: Apr. 2, 2024

(54) INTEGRATED CIRCUIT COMPRISING A SINGLE PHOTON AVALANCHE DIODE AND CORRESPONDING MANUFACTURING METHOD

(71) Applicants: STMicroelectronics (Crolles 2) SAS, Crolles (FR); STMicroelectronics (Research & Development) Limited, Marlow (GB)

(72) Inventors: Denis Rideau, Grenoble (FR); Dominique Golanski, Gieres (FR); Alexandre Lopez, Eindhoven (NL); Gabriel Mugny, Grenoble (FR)

(73) Assignees: STMicroelectronics (Crolles 2) SAS, Crolles (FR); STMicroelectronics (Research & Development) Limited, Marlow (GB)

( * ) Notice: Subject to any disclaimer, the term of this patent is extended or adjusted under 35 U.S.C. 154(b) by 180 days.

(21) Appl. No.: 17/546,503

(22) Filed: Dec. 9, 2021

(65) Prior Publication Data

US 2022/0190184 A1    Jun. 16, 2022

(30) Foreign Application Priority Data

Dec. 10, 2020  (FR) ..................................... 2012999

(51) Int. Cl.
*H01L 31/107*    (2006.01)
*H01L 31/18*    (2006.01)

(52) U.S. Cl.
CPC .......... *H01L 31/107* (2013.01); *H01L 31/186* (2013.01)

(58) Field of Classification Search
CPC ................. H01L 31/107; H01L 31/186; H01L 31/02027; H04N 25/773; G01J 2001/442
See application file for complete search history.

(56) References Cited

U.S. PATENT DOCUMENTS

| 8,093,624 | B1 * | 1/2012 | Renzi | H01L 31/107 |
| | | | | 257/E33.076 |
| 8,259,293 | B2 * | 9/2012 | Andreou | H01L 27/14603 |
| | | | | 356/222 |
| 11,362,231 | B2 * | 6/2022 | Sasago | H01L 27/1461 |
| 2010/0133636 | A1 * | 6/2010 | Richardson | H01L 31/107 |
| | | | | 257/438 |
| 2010/0159632 | A1 * | 6/2010 | Rhodes | H01L 27/1464 |
| | | | | 438/57 |

(Continued)

FOREIGN PATENT DOCUMENTS

FR    3041817 A1    3/2017

*Primary Examiner* — Earl N Taylor
(74) *Attorney, Agent, or Firm* — Crowe & Dunlevy LLC

(57) ABSTRACT

A single photon avalanche diode (SPAD) includes a PN junction in a semiconductor well doped with a first type of dopant. The PN junction is formed between a first region doped with the first type of dopant and a second region doped with a second type of dopant opposite to the first type of dopant. The first doped region is shaped so as to incorporate local variations in concentration of dopants that are configured, in response to a voltage between the second doped region and the semiconductor well that is greater than or equal to a level of a breakdown voltage of the PN junction, to generate a monotonic variation in the electrostatic potential between the first doped region and the semiconductor well.

19 Claims, 6 Drawing Sheets

(56) References Cited

U.S. PATENT DOCUMENTS

| | | | |
|---|---|---|---|
| 2011/0095388 A1* | 4/2011 | Richter | H01L 31/107 |
| | | | 257/E31.127 |
| 2014/0103196 A1* | 4/2014 | Soga | G01S 7/4865 |
| | | | 250/206 |
| 2015/0054111 A1* | 2/2015 | Niclass | H01L 27/1446 |
| | | | 257/438 |
| 2017/0092801 A1* | 3/2017 | Moussy | H01L 31/107 |
| 2019/0131479 A1* | 5/2019 | Stark | H01L 27/14649 |
| 2022/0093807 A1* | 3/2022 | Ayel | H01L 31/022408 |
| 2022/0310867 A1* | 9/2022 | Zimmer | H01L 31/103 |
| 2023/0066769 A1* | 3/2023 | Jung | H01L 27/1443 |

* cited by examiner

INTEGRATED CIRCUIT COMPRISING A SINGLE PHOTON AVALANCHE DIODE AND CORRESPONDING MANUFACTURING METHOD

PRIORITY CLAIM

This application claims the priority benefit of French Application for Patent No. 2012999, filed on Dec. 10, 2020, the content of which is hereby incorporated by reference in its entirety to the maximum extent allowable by law.

TECHNICAL FIELD

Embodiments and implementations relate to integrated circuits, in particular integrated circuits including at least one single photon avalanche diode (SPAD).

BACKGROUND

A SPAD is a semiconductor device based on a bipolar junction (PN junction) that is reverse polarized at a voltage exceeding the breakdown voltage of the junction.

The electric field resulting from the polarization is very high (for example greater than $5*10^5$ V/cm) such that a single charge carrier injected into the space charge area, for example generated by photoelectric effect, can trigger a self-sustained avalanche of charge carriers. A quenching circuit allows for stopping the avalanche effect and reset the SPAD diode to the polarization exceeding the breakdown voltage.

FIG. 1A illustrates an example of the structure of a depleted SPAD diode. To increase the size of the charge collection area, an intrinsic or quasi-intrinsic region I between the anode region P+ and the cathode region N+ is provided. To compensate for the increase in breakdown voltage resulting from the presence of this intrinsic region I, a region P is interposed between the cathode region N+ and the intrinsic region I.

However, this type of structure introduces a parasitic effect of "pockets" of charge carriers during the quenching of an avalanche, where the charges generated are trapped by an electrostatic potential barrier located substantially between the depleted anode region P and the intrinsic region I. This parasitic effect of pockets of carriers has the consequence of introducing parasitic secondary avalanches (usually "lags") disturbing the detection mechanism. Secondary parasitic avalanches caused when resetting the SPAD diode by the presence of charge pockets trapped in the active avalanche region have a detrimental effect on the performance of the device.

Reference is made in this regard to FIGS. 1B and 1C, where FIG. 1B illustrates lines of electrostatic equipotentials in a section of the volume of an embodiment of a SPAD diode having the structure of FIG. 1A, when the potential difference between the anode P+ and the cathode N+ is at the breakdown voltage; and where FIG. 1C illustrates the shape of the electrostatic potential PE along the axis Z of FIG. 1B.

The solid line curve in FIG. 1C represents the electrostatic potential when the SPAD diode is quenched, for a value close to the breakdown voltage Vb of the PN junction. The dotted curve in FIG. 1C represents the electrostatic potential when the SPAD diode is reset, at a voltage Vb+Vex greater than the breakdown voltage Vb of the PN junction by an amount Vex.

It can be seen on these curves that a potential well PKT is formed at the breakdown voltage Vb, when the SPAD diode is quenched. Thus, charges can remain trapped in the potential well PKT, which automatically triggers a parasitic avalanche effect when resetting to Vb+Vex.

Conventional solutions reducing the concentration of dopants in the depleted anode region P allow to limit the depth of the potential wells, but also introduce a loss in sensitivity of the diode called the photon detection probability (PDP).

There is therefore a need to guard against parasitic detection phenomena ("lags") without reducing the photon detection probability.

SUMMARY

According to one aspect, an integrated circuit comprises at least one single photon avalanche diode "SPAD" including a PN junction, in a semiconductor well doped with a first type of dopant, between a first region doped with the first type of dopant, called the avalanche region, and a second region doped with a second type of dopant opposite to the first type of dopant. According to a general feature of this aspect, the first doped region is shaped so as to incorporate local variations in the concentration of the dopants, adapted to generate a monotonic variation in the electrostatic potential between the first doped region and the semiconductor well, when the voltage between the second doped region and the semiconductor well is greater than or equal to the level of the breakdown voltage of the PN junction.

For example, the first type of dopant is the P type, that is to say the acceptor type, and the second type of dopant is the N type, that is to say the donor type. The semiconductor well may constitute the quasi-intrinsic (that is to say, lightly doped) region, the first doped region may constitute the depleted anode region, and the second doped region may constitute the cathode region of the SPAD diode.

The variations in the concentration of the dopants of the first doped region defined according to this aspect correspond, for example, to more weakly locally doped areas, so as not to generate a potential well (that is to say, reciprocally, so as to generate a monotonic variation in the electrostatic potential) at the corresponding positions. The charge carriers are not retained in pockets and can thus flow completely in the electric current of the polarized diode at the breakdown voltage (in particular during a quenching phase).

It will be noted that a potential well for a charge of a given polarity (for example positive) is a potential barrier for a charge of opposite polarity (respectively negative), and necessarily has a non-monoticity in the electrostatic potential, that is to say that the variation of the electrostatic potential is increasing in one interval and decreasing in another interval.

Furthermore, the variations in the concentration of dopants being local and not global, the remainder of the first doped region, that is to say the remainder of the avalanche region, can consequently be configured to maintain a significant electric field and thus remain efficient in terms of photon detection probability.

The variations in the concentration of dopants and their effects can be observed for example by means of Transmission Electron Microscopy (TEM), or by means of EMission MIcroscopy (EMMI) allowing to visualize the avalanche areas which emit photons.

According to one embodiment, the second doped region is located on the surface of the semiconductor well at a position centered in a photosensitive area of the SPAD diode, the first doped region comprises a first volume at the position centered at a depth in contact with the bottom of the second doped region, and a second annular volume laterally surrounding the first volume and at a depth remote from the second doped region but joining the depth of the first volume.

The first volume of the first doped region thus allows to construct the active region wherein the avalanche effects occur, while the second volume of the first doped region, located on the periphery of the active region, allows to electrically connect the first volume with contact points usually located on the surface of the well.

Furthermore, the first annular volume usually acts as a point for focusing carriers towards the avalanche region, preventing carriers from being evacuated through another route. Consequently, when recharging the diode, the carriers conventionally cannot pass through the annular volume.

However, according to one embodiment, the first volume and the second volume are laterally spaced apart by a gap, and said local variations in the concentration of dopants comprise areas for diffusing dopants in said gap having a lower concentration of dopants than in the first volume and the second volume.

Thus, the local variations in the concentration of the dopant in the gap provide an evacuation route for carriers during diode recharging ("quenching"). Furthermore, to prevent lateral breakdown of the first doped region, the electric field is intentionally reduced by moving the annular region (second volume) away from the main breakdown region (first volume).

Advantageously, the second volume further comprises a pattern locally passing through said gap to join the first volume (that is to say the avalanche region) in at least one position, so as to ensure electrical conduction between the second volume and the first volume.

Thus, the electrical conduction between the first and second volumes of the first doped region is not degraded in return for the presence of said gap providing an evacuation route for carriers trapped during recharging ("quenching").

According to one embodiment, the first volume and the second volume are laterally joined together and said local variations in the concentration of the dopants comprise areas in the first volume having a lower concentration of dopants than in the second volume.

Advantageously, the second volume further comprises a pattern inside the first volume, locally increasing the dopant concentration in the first doped region.

According to another aspect, a method is provided for manufacturing an integrated circuit comprising at least one single photon avalanche diode (SPAD). The method comprises, in a semiconductor well doped with a first type of dopant, an implantation of a first region doped with the first type of dopant, called an avalanche region, and an implantation of a second region doped with a second type of dopant opposite to the first type of dopant, so as to form the PN junction of the SPAD diode. According to a general feature of this aspect, the implantation of the first doped region comprises forming local variations in the concentration of the dopants, adapted to generate a monotonic variation in the electrostatic potential between the first doped region and the semiconductor well, when the voltage between the second doped region and the semiconductor well is greater than or equal to the level of the breakdown voltage of the PN junction.

According to one implementation, the second doped region is implanted on the surface of the well at a position centered in a photosensitive area of the SPAD diode, the implantation of the first doped region comprises a first implantation of a first volume at the centered position at a depth in contact with the bottom of the second doped region, and a second implantation of a second annular volume laterally surrounding the first volume and at a depth remote from the second doped region but joining the depth of the first volume.

According to one implementation, the first volume and the second volume are implanted so as to be laterally spaced apart by a gap, and said local variations in the concentration of dopants comprise areas for diffusing dopant in said gap having a lower concentration of dopants than in the first volume and the second volume.

Advantageously, the second implantation of the second volume further comprises an implantation of a pattern locally passing through said gap to join the first volume in at least one position, so as to ensure electrical conduction between the second volume and the first volume.

According to one implementation, the first volume and the second volume are implanted so as to be laterally joined together, the first implantation of the first volume being made at a concentration of dopants less than the concentration of dopants of the second volume, and said local variations in the concentration of dopants comprise areas in the first volume having a lower concentration of dopants than in the second volume.

Advantageously, the second implantation of the second volume further comprises an implantation of a pattern inside the first volume, locally increasing the dopant concentration in the first doped region.

BRIEF DESCRIPTION OF THE DRAWINGS

Other advantages and features of the invention will become apparent upon examining the detailed description of embodiments and implementations, which are in no way limiting, and of the appended drawings, wherein.

DETAILED DESCRIPTION

Figure 2A:
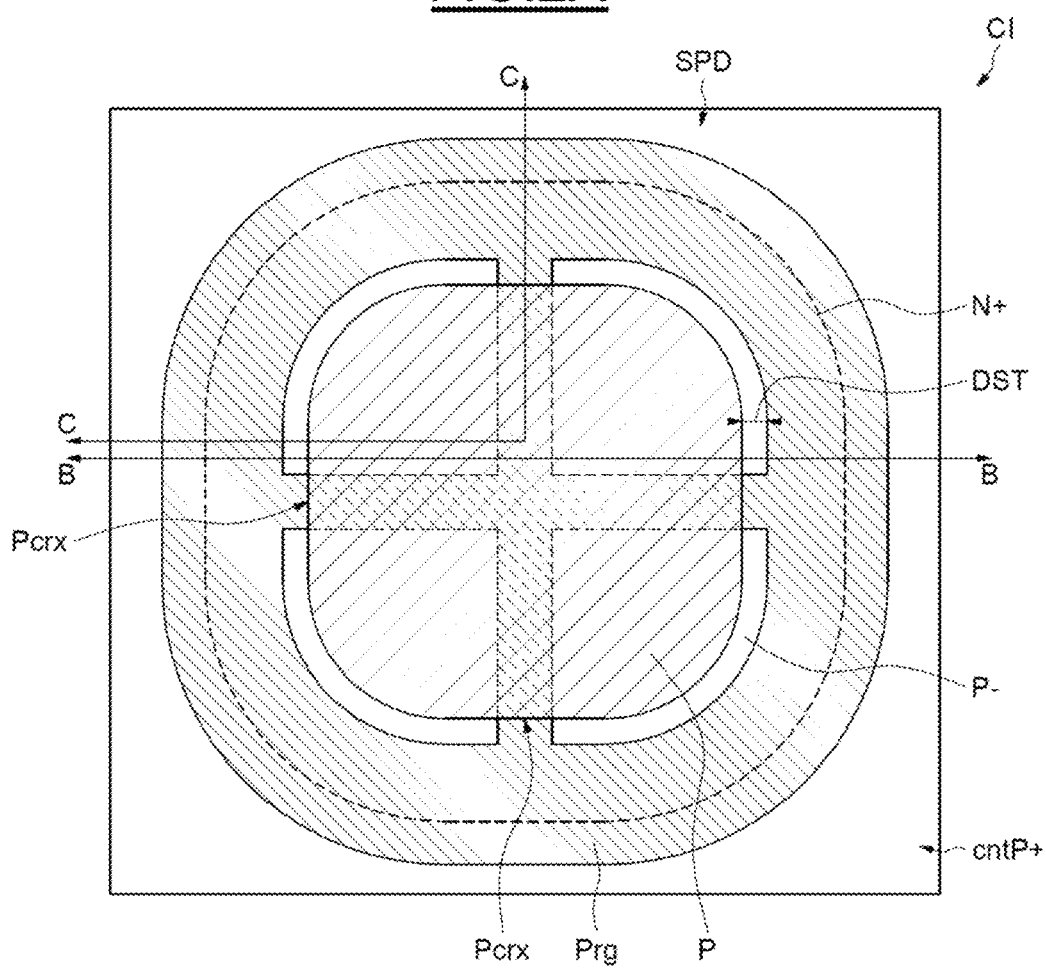
FIG. 2A illustrates a top view of a SPAD.

FIG. 2A illustrates a top view of a single photon avalanche diode (SPAD) SPD of an integrated circuit IC. For reasons of readability regarding the reference SPD, the acronym "SPAD", usually in uppercase letters, will be written in lowercase letters "spad" in the following.

Figure 2B:
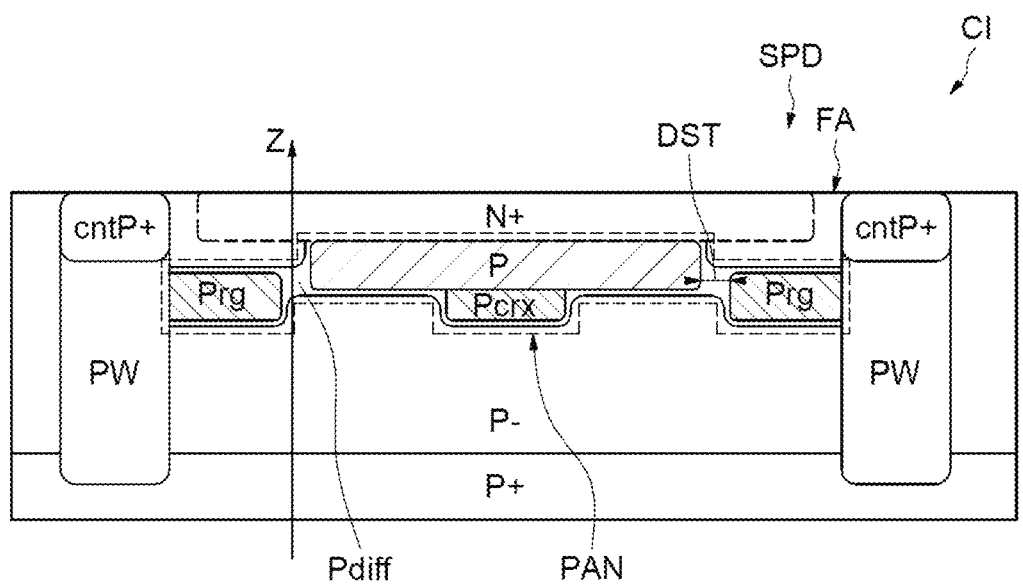
FIGS. 2B and 2C illustrate sectional views of the SPAD in FIG. 2A.

FIG. 2B illustrates a sectional view of the spad diode SPD in the plane BB of FIG. 2A, and shows the various semiconductor regions of the spad diode SPD.

Figure 2C:
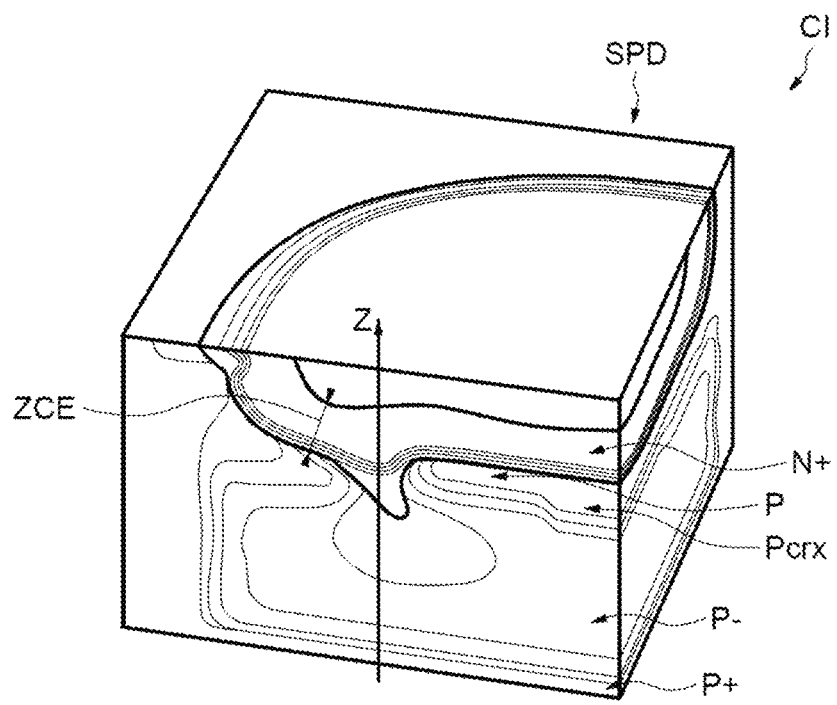

FIG. 2C illustrates a sectional view of a volume of the spad diode SPD in the volume CC of FIG. 2A, and shows the lines of electrostatic equipotentials during a polarisation of the spad diode SPD at a voltage close to the breakdown voltage of its PN junction.

Figure 2D:
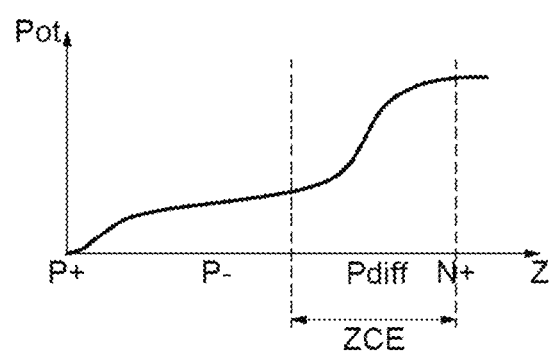
FIG. 2D illustrates the shape of the electrostatic potential.

FIG. 2D illustrates the shape of the electrostatic potential Pot along the axis Z of FIGS. 2B and 2C.

Reference is made to FIGS. 2A and 2B.

The diode SPD includes a PN junction between a first region PAN doped with a first type of dopant, and a second region N+ doped with a second type of dopant opposite to the first type.

Arbitrarily, the first type of dopant is chosen as the P type, that is to say acceptor dopants, and the second type of dopant is chosen as the N type, that is to say donor dopants. Equivalent structures having the opposite doping types can be considered.

A cathode region of the diode SPD includes the second doped region N+, which is strongly doped of the N type, implanted on the surface at a front face FA of the semiconductor device of the integrated circuit CI.

The cathode region N+ is located, in the plane of FIG. 2A, at a position centered in a photosensitive area of the diode SPD. The photosensitive area of the diode corresponds to the interface between the first doped region N+ and the second doped region PAN.

Local areas of the surface of the second doped region N+ can be adapted to provide a good ohmic contact connection, typically contact points including a thin layer of metal silicide (not shown).

An anode region of the diode SPD comprises different P-type doped semiconductor regions, including in particular the first doped region PAN, a lightly doped semiconductor well P−, sometimes referred to as "quasi-intrinsic" region, and an anode terminal region P+ at the bottom of the well P−.

The semiconductor well P− is, for example, formed by an in-situ doped epitaxy step, or by low concentration doping of an intrinsic substrate or of an intrinsic epitaxial layer.

The upper surface of the semiconductor well P− defines the front face FA of the semiconductor part of the integrated circuit CI.

The anode terminal region P+, at the bottom of the semiconductor well P−, may be formed by implantation of dopants before or after the formation of the semiconductor well P−.

The first doped region PAN includes a first volume, called the depleted anode region P or else the avalanche region, implanted at a depth adapted for the top of the depleted anode region P to be in contact with the bottom of the second doped region N+.

The depleted anode region P is located, in the plane of FIG. 2A, at a position centered opposite the cathode region N+.

The actual PN junction of the diode SPD is thus located at the interface between the depleted anode region P and the second doped cathode region N+.

The term "depleted anode region" comes from the fact that the space charge area ZCE (FIGS. 2C and 2D) completely encompasses the depleted anode region P when the spad diode SPD is "reset", that is to say, reverse polarized at a voltage greater, for example by +4V, than its breakdown voltage.

The anode region further includes a second volume, referred to herein as the anode ring Prg, implanted in an annular shape laterally surrounding (that is to say in the plane of FIG. 2A) the first volume P, and at a depth remote from the second doped region N+ but joining the depth of the first volume P (FIG. 2B).

The anode region further includes contact wells PW formed on the side contour of the anode ring Prg to electrically connect the anode P+ terminal and the anode ring Prg to ohmic contact points located at the front face FA. The ohmic contact points can conventionally comprise a heavily doped region cntP+ and a metal silicide layer (not shown).

During the manufacture of the spad diode SPD, the first volume P and the second volume Prg are implanted in areas which are spatially defined by implantation masks, typically made of photolithographed resin. The implantation masks spatially define the implantation areas, in the plane of FIG. 2A, so that the first volume P and the second volume Prg are laterally spaced by the gap DST.

After the implantations of the first volume P and of the second volume Prg, a phenomenon of diffusion of the implanted doping particles forms a decreasing dopant concentration gradient on the contour of the volumes P, Prg, called dopant diffusion areas Pdiff.

The dopant diffusion areas Pdiff occupy said gap DST between the first volume P and the second volume Prg, with a lower concentration of dopants than in the depleted anode region P (first volume) and the anode ring Prg (second volume).

Consequently, the first doped region PAN comprises local variations in dopant concentration, at the dopant diffusion areas Pdiff in the gaps DST separating the depleted anode region P and the anode ring Prg.

Note that the axis Z of FIG. 2B is positioned to pass through one of said local inhomogeneities of the dopant concentration in the first doped region PAN.

Furthermore, to ensure electrical conduction between the depleted anode region P and the anode ring Prg despite the gap DST separating them, the step of implanting the second volume comprises implanting a pattern Pcrx, locally passing through said gap DST in order to join the first volume P in at least one position.

The pattern Pcrx, implanted during the implantation of the second volume, consequently has the same dopant concentration and depth as the anode ring Prg.

The pattern may comprise bands of dopants diametrically passing through the inside of the ring shape of the second volume Prg, having a vertical position partially incorporated into the first volume P.

In this example, the pattern Pcrx has the shape of a cross with two perpendicular branches.

Figure 5A:
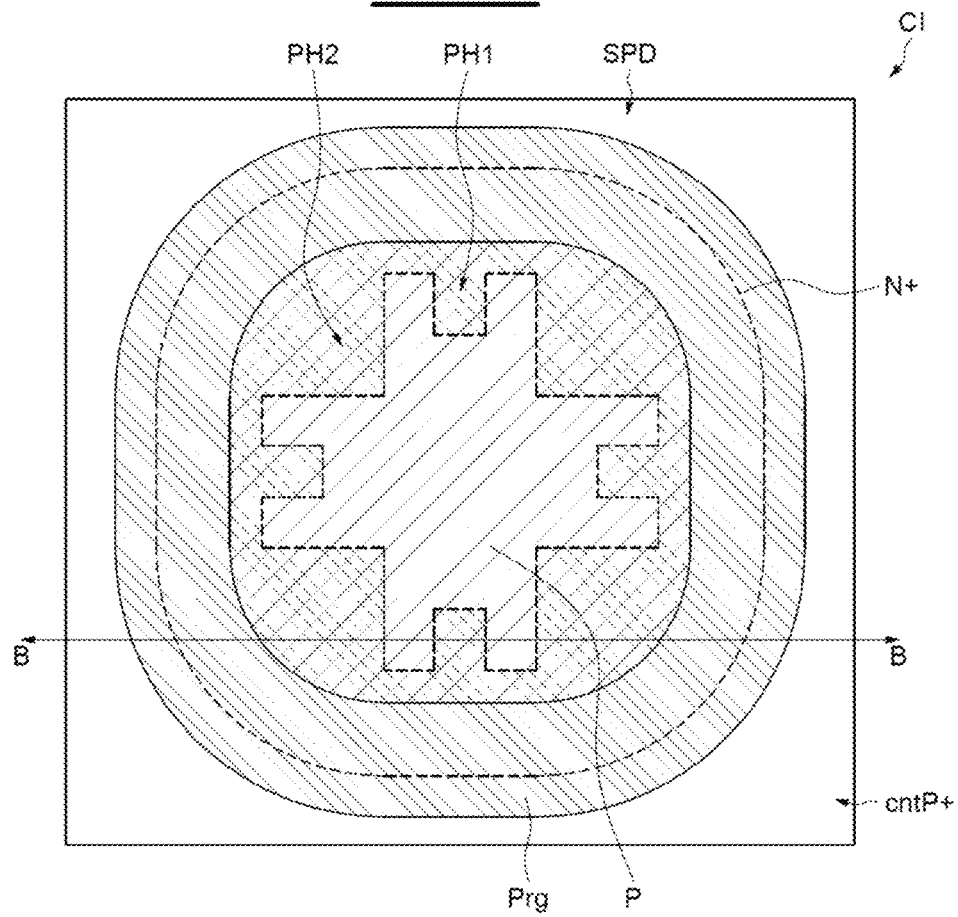
FIGS. 5A and 5B illustrate a top view and a sectional view, respectively, of a variant of a SPAD.

Alternatively, portions of bands directed radially towards the inside of the ring shape of the second volume Prg can join the first volume P without diametrically passing therethrough, reference may be made to the representation of FIG. 5A in this regard, in particular the elements PH1 of the pattern of FIG. 5A.

Reference is now made to FIGS. 2C and 2D.

It will be recalled that FIG. 2C shows the electrostatic equipotentials in a perspective view of the volume CC of the diode SPD of FIG. 2A, and FIG. 2D illustrates the shape of the electrostatic potential Pot along the axis Z of FIGS. 2B and 2C.

The various doped semiconductor regions P+, P−, Prg, Pcrx, P, N+ are not specifically shown in FIG. 2C but are nevertheless identified in the volume by their respective references.

The levels of the electrostatic potential are represented in FIGS. 2C and 2D in the case where the diode SPD is reverse polarized, between the cathode region N+ (second doped region) and the semiconductor well P−, at a voltage close to the breakdown voltage of the PN junction.

For example, the voltage close to the breakdown voltage is comprised between the breakdown voltage Vb and 1 (one) volt above the breakdown voltage Vb+1 volts.

In absolute terms, the reverse polarization is transmitted from the points of contact on the front face FA, and the voltage is strictly speaking defined between the cathode region N+ and the anode terminal region P+. However, it is considered that the voltage of the semiconductor well P− is equal to the voltage of the anode terminal region P+ (excluding avalanche phenomenon).

Figure 1A:
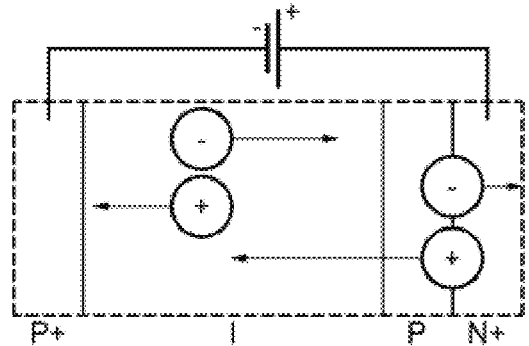
FIG. 1A illustrates an example of the structure of a depleted single photon avalanche diode (SPAD)
Figure 1B:
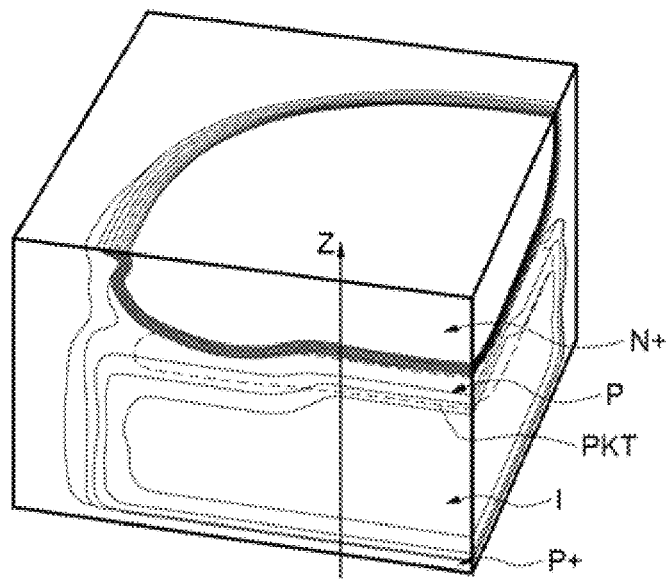
FIG. 1B illustrates lines of electrostatic equipotentials in a section of the volume of the SPAD having the structure of FIG. 1A.
Figure 1C:
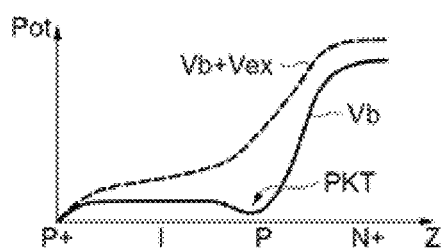
FIG. 1C illustrates the shape of the electrostatic potential PE along the axis Z of FIG. 1B.

Unlike the conventional case illustrated by FIGS. 1B and 1C, the shape of the electrostatic potential Pot along the axis Z (drawn in FIGS. 2B and 2C) does not have a potential well or barrier capable of trapping the charges generated during an avalanche effect, and consequently the spad diode SPD does not undergo the problems associated with charge carrier pockets.

Indeed, the local variations in the concentration of the dopants in the first doped region PAN generate a monotonic variation in the electrostatic potential Pot in their proximities between the first doped region PAN and the semiconductor well P− (that is to say an ever-increasing variation of the electrostatic potential Pot, from the semiconductor well P− to the first doped region PAN), when the voltage between the cathode region N+ and the semiconductor well P− is at the breakdown voltage of the PN junction.

Thus, all charges generated during an avalanche effect can circulate between the cathode region N+ and the anode terminal region P+ and are discharged into the avalanche current of the spad diode SPD.

As a result, the avalanche current quenching mechanisms reinitialize and reset the spad diode SPD to a completely depleted state and the parasitic avalanche triggering ("lag") caused by the pockets of charge carriers trapped by a potential barrier does not occur.

It will be noted that the electrostatic potentials of FIGS. 1B and 2C in particular are the results of finite element simulations of the Technology Computer-Aided Design (TCAD) type, having in particular the same mathematical model and the same calculation parameters.

The difference between the two simulations lies in the structure of the depleted anode region P and of the anode ring Prg implanted so as to comprise local variations in the concentration of the dopants, as previously described in relation to the FIGS. 2A and 2B; while for the results of FIG. 1B, the equivalent doped regions are joined together with a homogeneous concentration of dopants.

From the point of view of the performance of the spad diode SPD, in particular the photon detection probability "PDP", since the variations in dopant concentration are locally defined by the alignments of the implantations of the depleted anode region P and of the anode ring Prg (that is to say the implantations of the constituents of the first doped region PAN), the "overall" concentration of dopants in the second doped region PAN, in particular in the depleted anode region P, is not reduced, which does not reduce the performance of the SPAD diode.

The presence of the additional pattern Pcrx implanted with the anode ring Prg is particularly advantageous for maintaining, and even improving, the performance, in particular the "PDP", of the diode SPD.

Indeed, the concentration of dopants in the depleted anode region P, or more widely in the second doped region PAN, can be increased in order to improve the performance of the diode SPD, in particular the "PDP", without undergoing the conventional counterpart of an increase in parasitic triggers "lags".

Figure 3A:
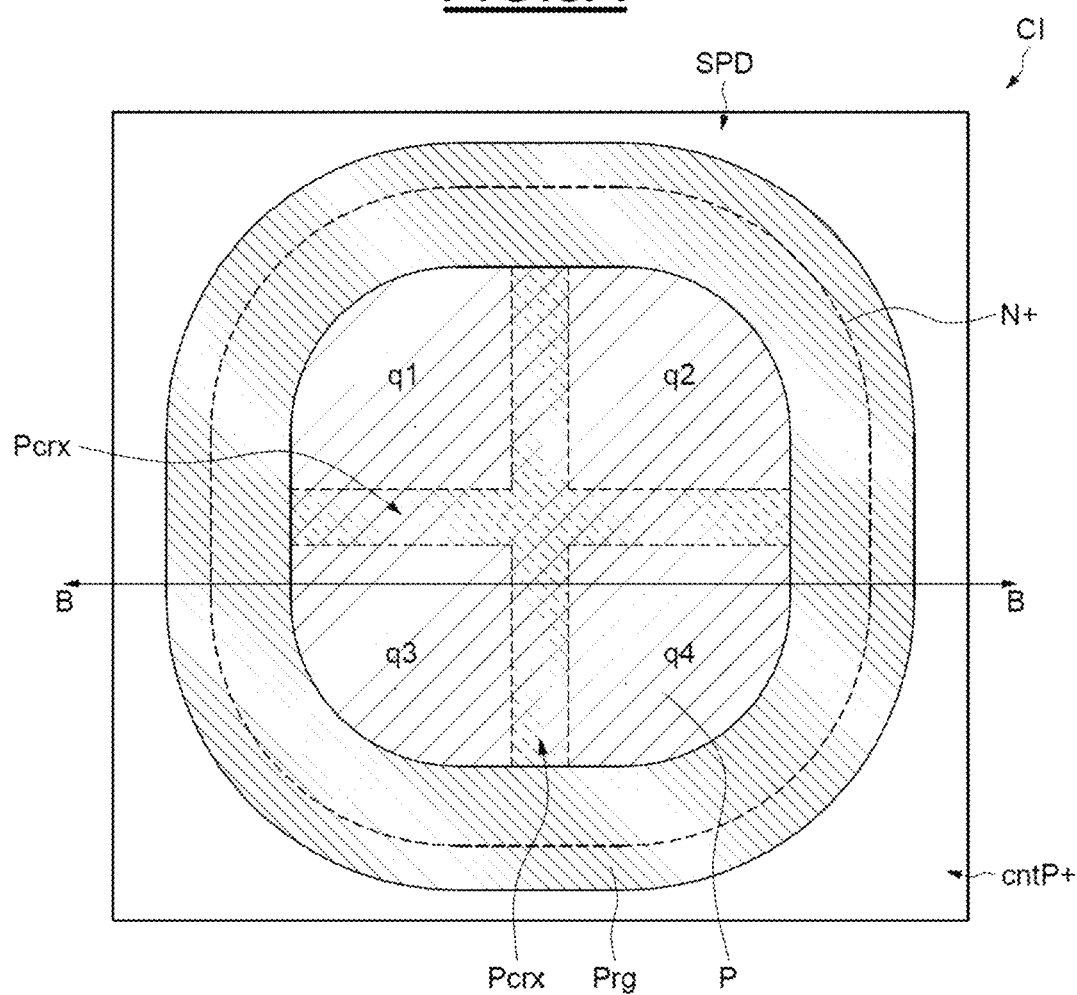
FIGS. 3A and 3B illustrate a top view and a sectional view, respectively, of another embodiment of a SPAD.
Figure 3B:
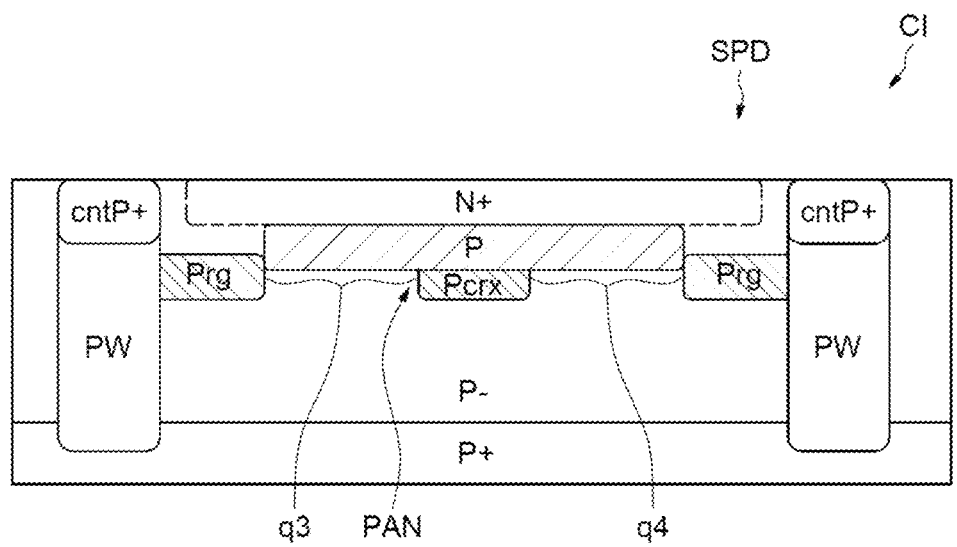

FIGS. 3A and 3B illustrate another embodiment of a spad diode SPD wherein the first doped region PAN comprises local variations in the concentration of dopants, adapted to generate a monotonic variation in the electrostatic potential between the first doped region PAN and the semiconductor well P−.

FIG. 3A shows a top view of the diode SPD, and FIG. 3B shows a sectional view in the plane BB of FIG. 3A.

The elements common to the example described in relation to FIGS. 2A to 2D bear the same references will not all be detailed again.

The first doped region PAN again comprises a first volume composed of the depleted anode region P, and a second volume composed of the anode ring Prg and a pattern Pcrx joining the first volume P and implanted at the same time as the anode ring Prg.

In this example, the depleted anode region P and the anode ring are not implanted with a gap therebetween (see, reference DST—FIGS. 2A, 2B), but the outer edge of the depleted anode region P and the inner edge of the anode ring are precisely aligned, with the tolerance of masking and implantation techniques.

The concentration of the dopants of the depleted anode region P is chosen so as to generate a monotonic variation in the electrostatic potential between the depleted anode region P and the semiconductor well P−, at a polarization between the cathode region N+ and the semiconductor well P− equal to the breakdown voltage of the PN junction.

In particular, the concentration of the dopants of the first volume P is chosen to be less than the concentration of the dopants of the second volume Prg, Pcrx.

In this example, the pattern Pcrx joins the first volume P, in order to locally increase the dopant concentration in the first doped region PAN.

The pattern can comprise bands of dopants Pcrx diametrically passing through the inside of the ring shape of the second volume Prg, having a vertical position partially incorporated in the first volume P, again illustrated in the example of a cross with two perpendicular branches.

In other words, the first doped region PAN comprises local variations in the concentration of dopants, adapted to generate a monotonic variation in the electrostatic potential between the first doped region PAN and the semiconductor well P−.

In this example, the variations in the concentration of dopants are located locally in the four quarters q1, q2, q3, q4 of the first volume P, delimited by the two branches Pcrx of the pattern.

Thus, on the one hand, the local variations in the concentration of dopants, in the first doped region PAN, comprise areas q1-q4 in the first volume P having a lower concentration of dopants than in the second volume Prg, which allow not to generate parasitic triggers "lags". On the other hand, the highest dopant concentration of the first doped region PAN, in the second volume Prg, Pcrx, allows to ensure good performance, in particular "PDP".

Figure 4A:
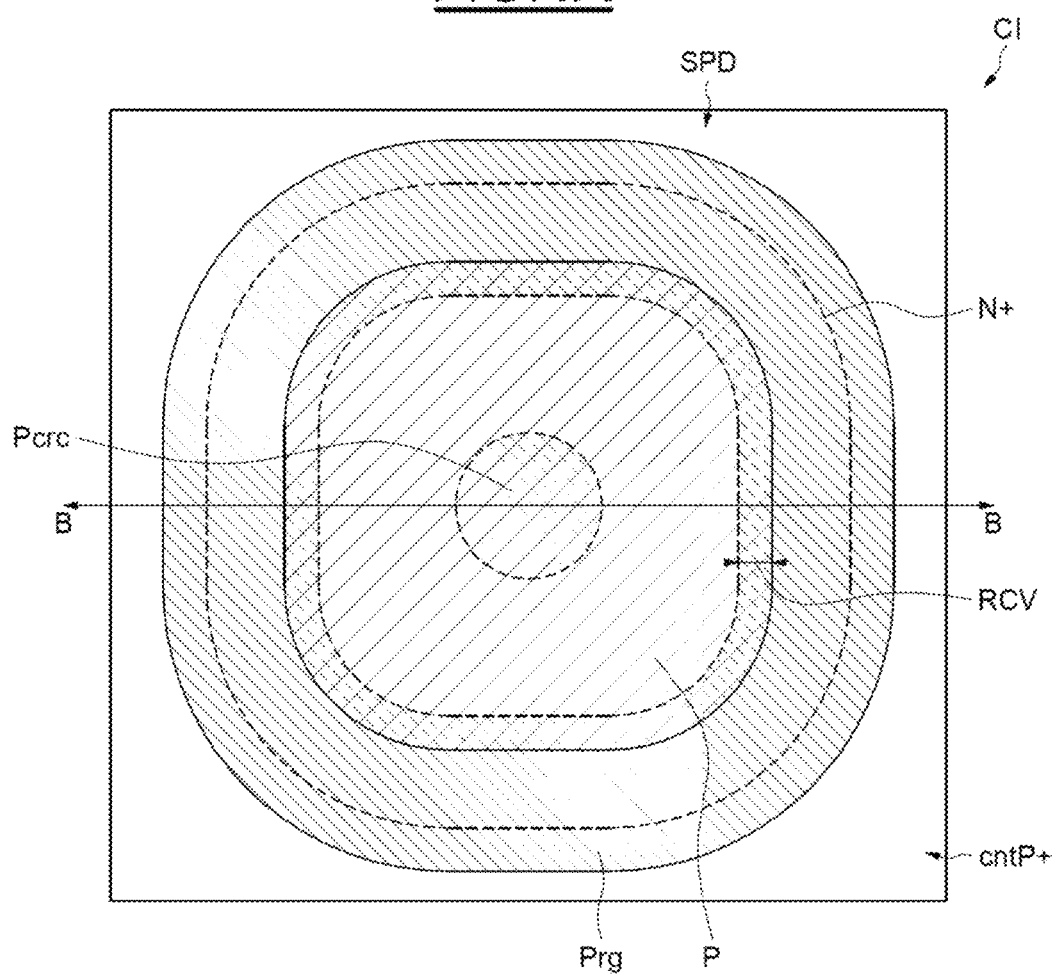
FIGS. 4A and 4B illustrate a top view and a sectional view, respectively, of a variant of a SPAD.
Figure 4B:
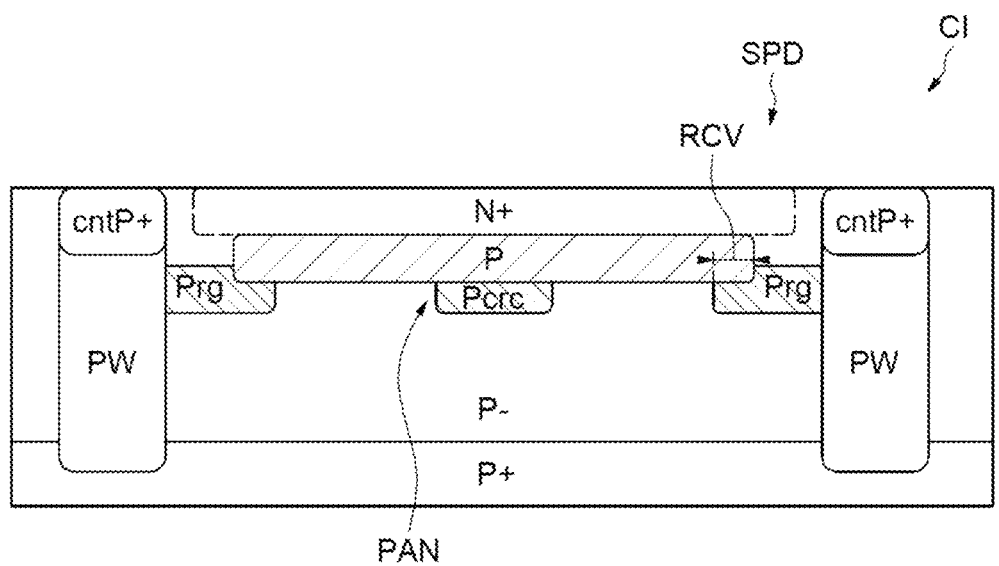

FIGS. 4A and 4B illustrate a variant of the exemplary embodiment of the spad diode SPD described in relation to FIGS. 3A and 3B, the common elements bear the same references and will not all be detailed again.

FIG. 4A shows a top view of the diode SPD, and FIG. 4B shows a sectional view in the plane BB of FIG. 4A.

In particular, in the first doped region PAN, the depleted anode region P (first volume) has a dopant concentration less than the dopant concentration in the anode ring Prg (second volume).

In this variant, the first volume P and the second volume Prg are implanted so as to be joined together on a lateral overlapping portion RCV, in a common vertical portion (the depth of the two volumes is identical to the previous descriptions in relation to FIGS. 2A to 3B).

The overlapping RCV of the first volume and the second volume ensures the electrical conduction of the anode ring Prg with the depleted anode region P.

Furthermore, in this variant, the second volume comprises a pattern Pcrc, having the shape of a disc implanted in the center of the diode (in the view of FIG. 4A), inside the first volume P. The pattern Pcrc thus locally increases the dopant concentration in the first volume P of the first doped region PAN.

In this variant, the local variations in the concentration of the dopants are formed by the lower concentration of the depleted anode region P in a bracelet-shaped area, the inner periphery of which is radially delimited by the perimeter of the disc Pcrc of the second volume, and the outer periphery of which is radially delimited by the inner perimeter of the anode ring Prg of the second volume.

Here again, on the one hand, the local variations in the concentration of dopants, in the first doped region PAN, comprise the bracelet-shaped area of the first volume P having a lower concentration of dopants than in the second volume Prg Pcrc, and allow not to generate parasitic triggers "lags". On the other hand, the higher concentration of dopants in the first doped region PAN, in the second volume Prg, Pcrc, ensures good performance, in particular "PDP".

Figure 5B:
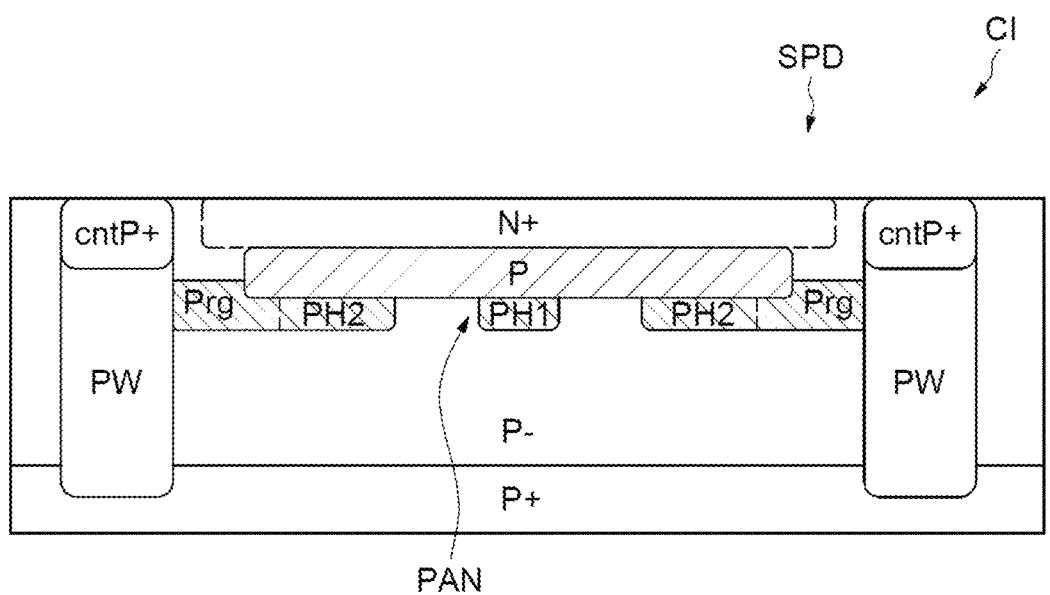

FIGS. 5A and 5B illustrate another variant of the exemplary embodiment of the spad diode SPD described in relation to FIGS. 3A and 3B, the common elements bear the same references and will not all be detailed again.

FIG. 5A shows a top view of the diode SPD, and FIG. 5B shows a sectional view in the plane BB of FIG. 5A.

In particular, in the first doped region PAN, the depleted anode region P (first volume) has a dopant concentration lower than the dopant concentration in the anode ring Prg (second volume).

In this other variation, the second volume comprises, in addition to the anode ring Prg, a pattern PH1, PH2 penetrating inside the first volume P, to locally increase the dopant concentration in the first doped region PAN.

The pattern includes band shapes PH1 radially directed inwardly of the ring shape of the second volume Prg and penetrating in the first volume P without diametrically passing therethrough.

The pattern includes square shapes PH2, two sides of which and one vertex penetrate in the direction of the diagonal of the square towards the center of the first volume P.

In the example of FIG. 5A, the shapes PH1, PH2 of the pattern of the second volume draw an identifiable contour with two perpendicular and superimposed "H" letters.

This example of a pattern allows to reinforce the dopant concentration of the first doped region PAN in the shapes PH1, PH2, and could also be used in the example described in relation to FIGS. 2A to 2D to locally pass through the gap (DST) and join the first volume P in at least one position, and thus ensure electrical conduction between the anode ring Prg and the depleted anode region P.

Other combinations of the various examples and variants given above can be considered and other shapes of patterns can be chosen to locally increase the dopant concentration in the first doped region PAN or else to ensure electrical conduction between the anode ring Prg and the depleted anode region P.

In summary, various exemplary embodiments of spad diodes SPD were presented, with a high photon detection probability, operating at moderate polarisation (for example less than 20V). The second doped region PAN allows the electric field to be concentrated, which in conventional cases leads to the formation of a pocket of charge carriers trapped by a potential barrier, and causing parasitic triggers "lags".

The various exemplary embodiments and variants of spad diodes SPD propose opening an evacuation path in the potential barrier, by means of a specific design of the doping of the semiconductor regions of the avalanche region of the diode, comprising in particular local variations in the concentration of dopants of the second doped region PAN. Among local variations in dopant concentration, areas of lower concentration open the evacuation paths in the potential barrier, and areas of greater concentration locally strengthen the electric field.

The invention claimed is:

1. An integrated circuit, comprising:
a semiconductor well doped with a first type of dopant; and
a single photon avalanche diode (SPAD) in the semiconductor well, said SPAD including a PN junction between a first region doped with the first type of dopant and a second region doped with a second type of dopant opposite to the first type of dopant;
wherein the first region comprises:
a first sub-region positioned in contact with a bottom of the second region and centered with respect to the second region;
a second sub-region forming an annular volume laterally surrounding the first sub-region and separated from the first sub-region at a gap by a portion of said semiconductor well; and
a third sub-region that diametrically connects opposite portions of the annular volume for the second sub-region and is in contact with a bottom of the first sub-region.

2. The integrated circuit according to claim 1, wherein the second region is located at a surface of the semiconductor well at a position centered in a photosensitive area of the SPAD.

3. The integrated circuit according to claim 2, wherein said gap has a lower concentration of dopants than in the first sub-region and the second sub-region.

4. The integrated circuit according to claim 3, wherein a portion of the third sub-region locally passes through said gap.

5. The integrated circuit according to claim 1, wherein the second sub-region and third sub-region have a same dopant concentration and same depth in the semiconductor substrate.

6. The integrated circuit according to claim 5, wherein a dopant concentration of the first sub-region is less than the same dopant concentration of the second sub-region and third sub-region.

7. An integrated circuit, comprising:
a semiconductor well doped with a first type of dopant; and
a single photon avalanche diode (SPAD) in the semiconductor well, said SPAD including a PN junction between a first region doped with the first type of dopant and a second region doped with a second type of dopant opposite to the first type of dopant;

wherein the first region comprises:
a first sub-region positioned in contact with a bottom of the second region and centered with respect to the second region;
a second sub-region forming an annular volume laterally surrounding the first sub-region and an in contact with at least a side edge of the first sub-region; and
a third sub-region that diametrically connects opposite portions of the annular volume for the second sub-region and is in contact with a bottom of the first sub-region.

8. The integrated circuit according to claim 7, wherein the second region is located at a surface of the semiconductor well at a position centered in a photosensitive area of the SPAD.

9. The integrated circuit according to claim 7, wherein the second sub-region and third sub-region have a same dopant concentration and same depth in the semiconductor substrate.

10. The integrated circuit according to claim 9, wherein a dopant concentration of the first sub-region is less than the same dopant concentration of the second sub-region and third sub-region.

11. An integrated circuit, comprising:
a semiconductor well doped with a first type of dopant; and
a single photon avalanche diode (SPAD) in the semiconductor well, said SPAD including a PN junction between a first region doped with the first type of dopant and a second region doped with a second type of dopant opposite to the first type of dopant;
wherein the first region comprises:
a first sub-region positioned in contact with a bottom of the second region and centered with respect to the second region;
a second sub-region forming an annular volume laterally surrounding the first sub-region and an in contact with at least a side edge of the first sub-region; and
a third sub-region that is laterally isolated from the second sub-region and positioned in contact with a bottom of the first sub-region.

12. The integrated circuit according to claim 11, wherein the third sub-region is centered with respect to the annular volume of the second sub-region.

13. The integrated circuit according to claim 11, wherein the second region is located at a surface of the semiconductor well at a position centered in a photosensitive area of the SPAD.

14. The integrated circuit according to claim 11, wherein the second sub-region and third sub-region have a same dopant concentration and same depth in the semiconductor substrate.

15. The integrated circuit according to claim 14, wherein a dopant concentration of the first sub-region is less than the same dopant concentration of the second sub-region and third sub-region.

16. An integrated circuit, comprising:
a semiconductor well doped with a first type of dopant; and
a single photon avalanche diode (SPAD) in the semiconductor well, said SPAD including a PN junction between a first region doped with the first type of dopant and a second region doped with a second type of dopant opposite to the first type of dopant;
wherein the first region comprises:
a first sub-region positioned in contact with a bottom of the second region and centered with respect to the second region;
a second sub-region forming an annular volume laterally surrounding the first sub-region and an in contact with at least a side edge of the first sub-region; and
a plurality of third sub-regions where each third region radially extends inwardly from the annular volume of the second sub-region and is in contact with a bottom of the first sub-region.

17. The integrated circuit according to claim 16, wherein the second region is located at a surface of the semiconductor well at a position centered in a photosensitive area of the SPAD.

18. The integrated circuit according to claim 16, wherein the second sub-region and third sub-region have a same dopant concentration and same depth in the semiconductor substrate.

19. The integrated circuit according to claim 18, wherein a dopant concentration of the first sub-region is less than the same dopant concentration of the second sub-region and third sub-region.

* * * * *